United States Patent [19]
Kang et al.

[11] Patent Number: 5,789,796
[45] Date of Patent: Aug. 4, 1998

[54] PROGRAMMABLE ANTI-FUSE DEVICE AND METHOD FOR MANUFACTURING THE SAME

[75] Inventors: Sang-Won Kang; Jong-Tae Baek, both of Daejeon, Rep. of Korea

[73] Assignee: Electronics and Telecommunications Research Institute, Daejeon, Rep. of Korea

[21] Appl. No.: 917,171

[22] Filed: Aug. 25, 1997

Related U.S. Application Data

[63] Continuation of Ser. No. 606,550, Feb. 26, 1996, abandoned, which is a continuation of Ser. No. 260,909, Jun. 15, 1994, abandoned.

[30] Foreign Application Priority Data

Jul. 26, 1993 [KR] Rep. of Korea ............... 199314240

[51] Int. Cl.$^6$ ............................................. H01L 29/00
[52] U.S. Cl. .................................... 257/530; 257/50
[58] Field of Search ............................... 257/530, 50

[56] References Cited

U.S. PATENT DOCUMENTS

| | | | |
|---|---|---|---|
| 4,914,055 | 4/1990 | Gordon et al. | 437/192 |
| 5,087,958 | 2/1992 | Chen et al. | 257/529 |
| 5,148,256 | 9/1992 | Potash et al. | 257/530 |
| 5,191,550 | 3/1993 | Kubota | 365/96 |
| 5,210,598 | 5/1993 | Nakazaki et al. | 257/530 |
| 5,233,206 | 8/1993 | Lee | 257/50 |
| 5,242,851 | 9/1993 | Choi | 937/49 |
| 5,311,039 | 5/1994 | Kimura et al. | 257/530 |
| 5,373,169 | 12/1994 | McCollum et al. | 257/530 |
| 5,508,220 | 4/1996 | Eltoukhy et al. | 257/530 |

*Primary Examiner*—J. Carroll
*Attorney, Agent, or Firm*—Jacobson, Price, Holman & Stern, PLLC

[57] ABSTRACT

The present invention relates to a technology of an electrically programmable anti-fuse device. The anti-fuse device comprises a semiconductor substrate provided with a plurality of functional elements; a field oxide layer formed on said semiconductor substrate, for electrically isolating the functional elements from each other; a predetermined pattern of a first electrode formed on said field oxide layer; a first insulating layer having two contact holes isolated from each other only on said first electrode, deposited on said field oxide layer as well as both end portions and center portion of said first electrode; a second insulating layer formed in said contact holes, to serves as an interlayer; and a second electrode formed on said second insulating layer.

7 Claims, 3 Drawing Sheets

PROGRAMMABLE ANTI-FUSE DEVICE AND METHOD FOR MANUFACTURING THE SAME

This is a continuation of Ser. No. 08/606,550, filed on Feb. 26, 1996, abandoned, which is a continuation of Ser. No. 08/260,909, filed on Jun. 15, 1994, abandoned.

BACKGROUND OF THE INVENTION

1. Field of the Invention

The present invention relates to a technology of a semiconductor device, more particularly to an electrically programmable anti-fuse device.

Integrated circuits are usually made with all internal connections set during manufacturing of the circuits.

However, because of high development costs and high manufacturing tooling costs of such integrated circuits, users have desired circuits which can be configured or programmed for applying to a specific purpose.

Such circuits are called programmable circuits and are programmed by selectively breaking or creating a series of programmable links. The programmable links mean electrical interconnects which are either broken or created at selected electronic nodes in the circuit by the user after the integrated circuit has been manufactured and packaged in order to activate or deactivate the selected electronic nodes respectively as is the case with PROM (programmable ROM) programmed to perform a desired function.

Fusible links have been widely used and well known in PROM devices. The PROM device usually consists of an X-Y matrix or lattice of conductors or semiconductors. At each cross-over point of the lattice, a conducting link connects transistors or other electronic nodes to the network of the lattice.

The PROM is programmed by supplying high programming current with predesignated fusible links connected to the selected nodes, when the links are blown out to create an open circuit. The combination of blown links represents a digital bit pattern of ones and zeros which user wishes to store in the PROM.

Another type of programmable links, called an anti-fuse link, has been developed to be used in the integrated circuits in order to overcome disadvantages of said fusible links such as relatively high programming voltages and high current levels are required during programming and the shape and size of the fusible links must be precise so that the link may function effectively as a conductor.

Anti-fuse links are typically formed to contain two conductor and/or semiconductor elements interposing some kind of a dielectric or insulating material between them. During programming, the dielectric at the selected point between the conductive materials is broken down by a supplied current from a predetermined programming voltage applied to conductive elements of said selected links, thereby electrically connecting the conductor or semiconductor elements.

As the above, prior art anti-fuse element comprises upper and lower electrode layers on a semiconductor substrate provided with at least one functional element such as a semiconductor element, a conductor element or the like, and an interlayer formed of an insulating material or a dielectric material, to be formed between the two electrode layers, and is programmed by breaking said interlayer between the two electrode layers so that the two electrode layers are electrically conductive with each other. As a result, a desired programming in such an anti-fuse element can be obtained by users.

FIG. 1 is a cross section showing the structure of the conventional anti-fuse element. Referring to FIG. 1, reference numeral 10 represents a semiconductor substrate provided with functional elements such as semiconductor and conductor elements, and reference numeral 11 represents each of field oxide layers formed on the semiconductor substrate 10 so as to isolate the functional elements from each other.

In FIG. 1, a lower electrode 12 doped with $N^+$ impurity ion of high concentration is formed between the field oxide layers 11 on the semiconductor substrate 10, and an insulating or a dielectric material serving as an interlayer 13 is deposited on the lower electrode 12 and the field oxide 11. An upper electrode 14 which is formed of a polysilicon layer doped with $N^+$ impurity ion of high concentration is deposited on the interlayer 13.

In order to perform a desirable function in the anti-fuse element of the above structure, said interlayer 13 is broken in accordance with programming of a user, whereby the upper and lower electrodes 12 and 14 are electrically made conductive.

In the conventional anti-fuse elements as explained above, since one functional element is formed between the two field oxide layers 11, it is impossible to use the functional element when a preferred electrical conduction is not performed during the programming process to connect the upper electrode 14 and the lower electrode 12 with each other by breaking interlayer 13. Also, an additional fusing process is required for conducting upper and lower electrodes in a different position from the position of the functional element.

Additionally, in the fusing process of the conventional anti-fuse elements, as the lower and upper electrode which are formed of polysilicon layers respectively doped with the high concentrated impurity ion only contact with each other, it has a disadvantage of a relatively high contact resistance, compared with the structure of an anti-fuse element in which impurity ions of upper electrode are penetrated to lower electrode. Due to such a high contact resistance in the anti-fuse element, a conductive property between the upper and lower electrodes is lowered.

SUMMARY OF THE INVENTION

In order to overcome the disadvantages of the conventional anti-fuse device discussed above, it is one object of the present invention to provide a programmable anti-fuse device in which a material of an upper electrode is penetrated into the lower electrode during a fusing process to form a conducting path, and a method of manufacturing the same.

It is another object of the present invention to provide a programmable anti-fuse element in which at least two upper electrodes are laminated above one lower electrode so as to enable a retrial of the fusing process in another upper electrode when a fusing error occurs in a first upper electrode, and a method of manufacturing the same.

According to one aspect of the present invention, the electrically programmable anti-fuse device comprising: a semiconductor substrate provided with a plurality of functional elements; a field oxide layer formed on said semiconductor substrate, for electrically isolating the functional elements from each other; a predetermined pattern of a first electrode formed on said field oxide layer; a first insulating layer having two contact holes isolated from each other only on said first electrode, deposited on said field oxide layer as well as both end portions and center portion of said first electrode; a second insulating layer formed in said contact holes, to serves as an interlayer; and a second electrode formed on said second insulating layer.

In this embodiment, said second electrode is comprised of at least two electrode portion which are electrically isolated from each other by said first insulating layer, said second electrode is made of aluminum based alloy, and said first insulating layer is made of a low-temperature oxide layer.

Also, in this embodiment, said first electrode is made of a polysilicon layer doped with a high concentrated impurity ion, said impurity ion is $P^+$ type of impurity ion, said second insulating layer is made of $SiO_2$, $Si_3N_4$ or silicon oxide nitride, and said second insulating layer is made of a dielectric material of amorphous silicon.

Furthermore, said second insulating layer is made of a composite interlayer including insulating and dielectric materials.

An electrically programmable anti-fuse device, can be made by a method comprising the steps of: preparing a semiconductor substrate provided with a plurality of functional elements; forming a field oxide layer on said semiconductor substrate to electrically isolate said functional elements from each other; forming a first electrode having a predetermined pattern on said field oxide layer; coating a first insulating layer on said field oxide layer as well as said first electrode; selectively etching said first electrode to form two contact holes isolated from each other on said first electrode; forming a second insulating layer in said contact holes so as to form an interlayer; and forming a second electrode on said second insulating layer.

The step of forming said first electrode comprises coating a polysilicon layer on said field oxide layer, doping $P^+$ impurity ion in said polysilicon layer, and etching said polysilicon layer doped with the impurity ion to form said first electrode.

Also, the step of forming said second electrode comprises coating an aluminum metal layer on said first insulating layer as well as said second insulating layer, and etching said aluminum metal layer so as to form a second electrode on said second insulating layer.

Furthermore, said second electrode is comprised of at least two electrode portions which are electrically isolated from each other by said first insulating layer, said second electrode is made of aluminum based alloy, said first insulating layer is made of a low-temperature electrode layer, said first electrode is made of a polysilicon layer doped with high concentrated impurity ion.

In addition, said impurity ion is made of $P^+$ type of impurity ion, said second insulating layer is made of $SiO_2$, $Si_3N_4$, or silicon oxide nitride, and said second insulating layer is made of a dielectric material of amorphous silicon.

DETAILED DESCRIPTION OF THE PREFERRED EMBODIMENT

FIGS. 2A to 2D show steps of manufacturing the programmable anti-fuse device of the present invention.

Figure 1:
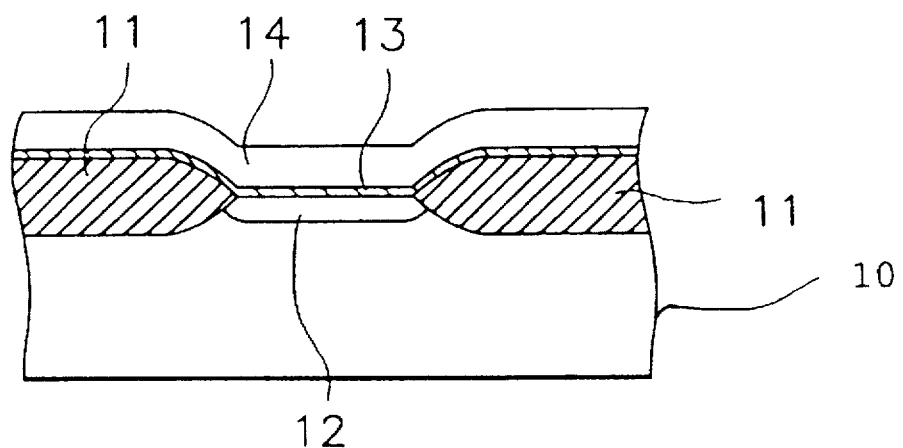
FIG. 1 is a cross sectional view showing a structure of the conventional FPGA anti-fuse switching element.
Figure 2A:
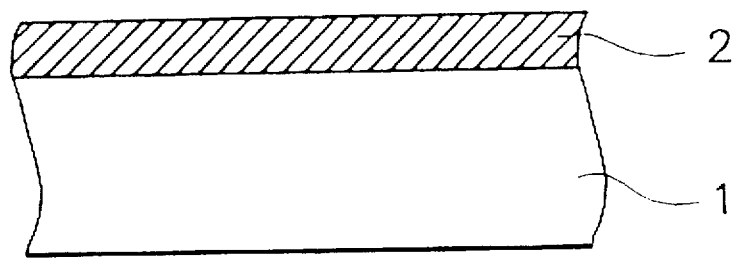
FIGS. 2A to 2D are cross section views showing steps of manufacturing anti-fuse elements according to a preferred embodiments of the present invention.

Referring to FIG. 2A, reference numeral 1 represents a semiconductor substrate provided with functional elements (not shown) on a silicon wafer, and reference numeral 2 represents a field oxide layer formed on the semiconductor substrate 1 so as to isolate the functional elements from each other. In FIG. 2A, it seems as if the field oxide layer 2 covers the whole surface of the semiconductor substrate 1. However, the field oxide layer 2 covers only inactive regions where the functional elements are not formed in the semiconductor substrate 1.

Figure 2B:
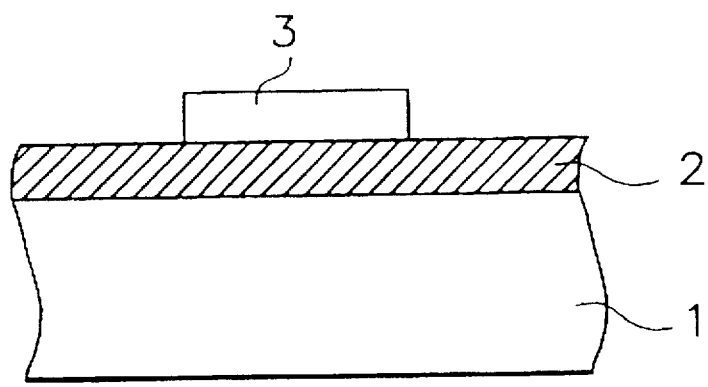

FIG. 2B shows the step of manufacturing a lower electrode. In FIG. 2B, a predetermined pattern of polysilicon layer 3 doped with $P^+$ impurity ion of high concentration, for example boron ion, is deposited on the field oxide layer 2 to form a lower electrode. The process for forming the lower electrode comprises the steps of coating a polysilicon layer on overall surface of the field oxide layer 2, doping $P^+$ impurity ion in said polysilicon layer, and selectively etching the polysilicon layer doped with the impurity ion using a well-known photo etching method thereby to form the lower electrode 3.

Figure 2C:
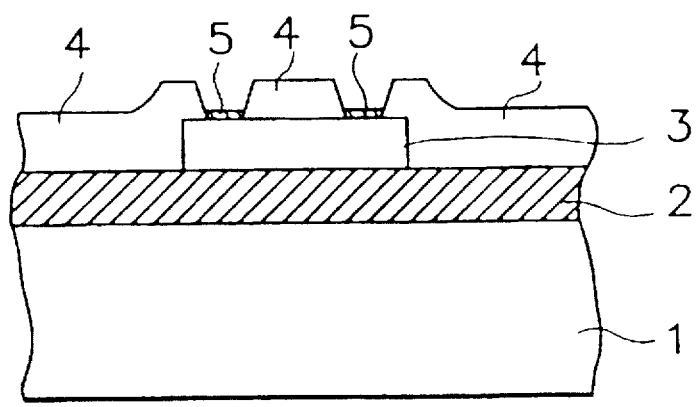

FIG. 2C describes the step of manufacturing an interlayer by forming contact holes. As shown in FIG. 2C, after formation of a low-temperature oxide layer on the lower electrode as well as the exposed surface of the field oxide layer 2, the low-temperature oxide layer is selectively etched so as to form two exposed surfaces, i.e., two contact holes on the lower electrode. The low-temperature oxide layer functions as a first insulating layer. Subsequently, the interlayer 5 is formed only on each of the exposed surfaces of the interlayer 3 through each of the contact holes and functions as a second insulating layer.

In this embodiment, said interlayer 5 may be formed of an insulating film such as $SiO_2$, $Si_3N_4$, a silicon oxide nitride or the like, or a dielectric film such as amorphous silicon. Also, a composite layer including the insulating and dielectric materials may be used as the interlayer.

Figure 2D:
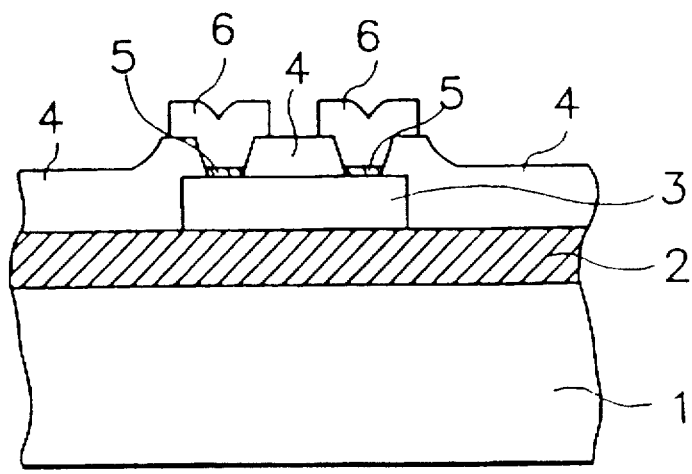

FIG. 2D illustrates the step for forming an upper electrode. As shown in FIG. 2D, a metal electrode made of aluminum is formed on the interlayer 5 to form two upper electrodes 6 isolated by the interlayer 4. The process for forming the upper electrodes corresponding to the two contact holes comprises the steps of coating an aluminum metal film over the surface of low-temperature oxide layer 4 as well as the surface of the interlayer, and selectively etching said aluminum metal film using the above-mentioned photo etching method in a predetermined pattern, thereby forming the two upper electrodes 6 isolated from each other on the interlayer.

According to the above-mentioned anti-fuse structure, since two upper electrodes are formed for one lower electrode, even in case that a fusing error occurs between one of the two upper electrodes and the lower electrode after completion of the fusing process for performing a desired programming, another fusing process for fusing the other of the upper electrodes and the lower electrode may be performed, thereby improving the repairing capacity. Also, according to the method for manufacturing the anti-fuse element, it is possible to produce an anti-fuse element having a low capacitance and a low leakage current before fusing.

Especially, in the anti-fuse element manufactured according to the present invention, when the interlayer is broken by the fusing process and therefore the upper and lower electrodes are electrically made conductive with each other, an aluminum path is formed within the polysilicon layer by penetration of aluminum material in the upper electrode into the lower electrode of P⁺ polysilicon layer laid in the vertical direction thereto.

The above aluminum path make it possible the electrical conduction between the upper and lower electrodes through the aluminum metal wiring, thereby lowering the contact resistance in the interface of the upper and lower electrodes on the base of the inherent property of aluminum. Thus, the electrical conduction of upper and lower electrodes after fusing may be highly improved as the contact resistance of the upper and lower electrodes is lowered.

Figure 3:
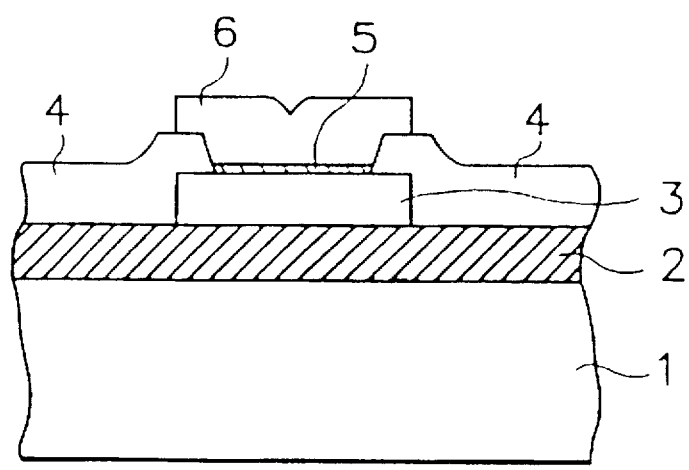
FIG. 3 is a cross sectional view showing the structure of another anti-fuse element according to another embodiment of the present invention.

FIG. 3 shows the structure of anti-fuse element fabricated according to another embodiment of the present invention.

The structure of the anti-fuse element as shown in FIG. 3 is different from the structure of FIG. 2D. The anti-fuse element of FIG. 2D has the structure that one upper electrode 6 and one lower electrode 3 has an interlayer 5 formed between them. That is, the anti-fuse element of FIG. 2D has the structure that two upper electrodes 6 are formed on one lower electrode 3, while the anti-fuse element of FIG. 3 has the structure that one upper electrode 6 only is formed on one lower electrode 3. Therefore, in the structure of FIG. 3, a low-temperature oxide layer for isolating two upper electrodes on the lower electrode is not required.

So, the steps of manufacturing the anti-fuse element shown in FIG. 3 are the same as the steps of FIGS. 2A to 2D except that in FIG. 2C the low-temperature oxide layer is etched not to coat the lower electrode.

As a result, FIG. 2D shows an arrangement of upper electrode-interlayer(an insulating layer, a dielectric layer, or a composite layer)-lower electrode-interlayer-upper electrode while FIG. 3 shows an arrangement of upper electrode-interlayer-lower electrode.

Though the embodiments of the invention describe the structure having one or two upper electrodes on one lower electrode, the present invention is not limited to the description as set forth herein. Furthermore, it is to be apparent to one skilled in this field that more than three upper electrodes on one lower electrode have relatively improved effect as compared with that of the above structure in which one or two upper electrodes are formed on one lower electrode.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claims is:

1. An electrically programmable anti-fuse device comprising:

a semiconductor substrate provided with a plurality of functional elements;

a field oxide layer formed on said semiconductor substrate for electrically isolating the functional elements from each other;

a predetermined pattern of a first electrode of a polysilicon layer doped with a high concentration of an impurity ion formed on said field oxide layer;

a first insulating layer on said field oxide layer as well as both end portions and center portion of said first electrode, said first insulating layer having one contact hole which exposes only a portion of said first electrode and a further contact hole which is isolated from said one contact hole, and each said contact hole only exposing a separate portion of said first electrode;

second insulating layer formed only in each of said contact holes and serving as an interlayer; and a second and a third electrode of an aluminum based alloy extending respectively into said one contact hole and said further contact hole and formed vertically on said second insulating layers in said one contact hole and said further contact hole, said second and third electrodes being electrically isolated from each other by said first insulating layer such that a circuit can be made between said second electrode and said first electrode and between said third electrode and said first electrode upon the application of a fusing process;

whereby should one of said second or third electrodes be defective, the other of said electrodes can be fused to said first electrode upon the application of a fusing process.

2. The anti-fuse device according to claim 1, wherein said second electrode is comprised of at least two electrode portion which are electrically isolated from each other by said first insulating layer.

3. The anti-fuse device according to claim 1, wherein said first insulating layer is made of a low-temperature oxide layer.

4. The anti-fuse device according to claim 1, wherein said impurity ion is P⁺ type of impurity ion.

5. The anti-fuse device according to claim 1, wherein said second insulating layer is made of $SiO_2$, $Si_3N_4$ or silicon oxide nitride.

6. The anti-fuse device according to claim 1, wherein said second insulating layer is made of a dielectric material of amorphous silicon.

7. The anti-fuse device according to claim 1, wherein said second insulating layer is made of a composite interlayer including insulating and dielectric materials.

* * * * *